(12) United States Patent
Hashikura

(10) Patent No.: US 9,402,324 B2
(45) Date of Patent: Jul. 26, 2016

(54) ELECTRICAL JUNCTION BOX

(71) Applicants: AUTONETWORKS TECHNOLOGIES, LTD, Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Manabu Hashikura, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/426,628

(22) PCT Filed: Sep. 6, 2013

(86) PCT No.: PCT/JP2013/074098
§ 371 (c)(1),
(2) Date: Mar. 6, 2015

(87) PCT Pub. No.: WO2014/042095
PCT Pub. Date: Mar. 20, 2014

(65) Prior Publication Data
US 2015/0230352 A1    Aug. 13, 2015

(30) Foreign Application Priority Data

Sep. 11, 2012   (JP) .................................. 2012-199350

(51) Int. Cl.
*H05K 7/20* (2006.01)
*H05K 5/02* (2006.01)
(Continued)

(52) U.S. Cl.
CPC .......... *H05K 5/0213* (2013.01); *B60R 16/0238* (2013.01); *H02G 3/08* (2013.01); *H05K 7/20127* (2013.01)

(58) Field of Classification Search
CPC ........................ H05K 5/0213; H05K 7/20127
See application file for complete search history.

(56) References Cited

U.S. PATENT DOCUMENTS 5,787,576 A    8/1998  Warren et al.
6,215,101 B1 *  4/2001  Kondo ................... H05K 3/301
                                                      174/535

(Continued)

FOREIGN PATENT DOCUMENTS

DE         4415133 C1      6/1995
JP       2003-031095 A     1/2003
(Continued)

OTHER PUBLICATIONS

Nov. 19, 2013 International Search Report issued in International Patent Application No. PCT/JP2013/074098.
(Continued)

*Primary Examiner* — Hung V Ngo
(74) *Attorney, Agent, or Firm* — Oliff PLC

(57) ABSTRACT

An electrical junction box includes a casing and a relay that is accommodated in the casing and has a relay case and a terminal portion, the terminal portion being accommodated in the relay case and having a fixed contact and a movable contact. A small heat amount-generating region that generates a smaller amount of heat than the relay does when current flows through the relay is formed in the casing, and the relay is disposed such that the fixed contact and the movable contact are located on the small heat amount-generating region side.

8 Claims, 14 Drawing Sheets

(51) Int. Cl.
*H02G 3/08* (2006.01)
*B60R 16/023* (2006.01)

(56) References Cited

U.S. PATENT DOCUMENTS

| | | | | |
|---|---|---|---|---|
| 8,792,242 B2* | 7/2014 | Wetzel | ................. | H05K 5/0082 361/707 |
| 2001/0015887 A1 | 8/2001 | Sanada et al. | | |
| 2001/0021103 A1* | 9/2001 | Takagi | ................. | B62D 5/0406 361/752 |
| 2007/0086152 A1* | 4/2007 | Sasaki | ................. | B60R 16/0239 361/679.02 |

FOREIGN PATENT DOCUMENTS

| | | |
|---|---|---|
| JP | 2007-312539 A | 11/2007 |
| JP | 2010-108661 A | 5/2010 |
| WO | 2006/066983 A1 | 6/2006 |

OTHER PUBLICATIONS

Aug. 24, 2015 Search Report issued in European Application No. 13837058.0.

* cited by examiner

ELECTRICAL JUNCTION BOX

BACKGROUND

This application relates to an electrical junction box.

BACKGROUND ART

Conventionally, an electrical junction box has been used, for example, as a module having a function of controlling power distribution from a common power source to various vehicle electrical components in a vehicle. This electrical junction box accommodates various electrical components such as a relay and a fuse in a casing. The relay disclosed in Patent Document 1 is known as a relay to be used in the electrical junction box having such a configuration.

CITATION LIST

Patent Documents

Patent Document 1: JP 2010-108661A

The relay disclosed in Patent Document 1 includes an electrical component case, a terminal portion accommodated in the electrical component case, a coil connected to the terminal portion, and a metal plate disposed separately from the terminal portion so as to be exposed to the inside and the outside of the electrical component case. With this configuration, water vapor generated in the electrical component case as the coil in the electrical component case generates heat can be caused to actively condense on the metal plate when an ambient environmental temperature decreases, thus suppressing dew condensation on a contact included in the terminal portion and preventing a conduction failure of the contact due to the condensed dew freezing.

However, the technique disclosed in Patent Document 1 is a technique for preventing the conduction failure of the contact due to the condensed dew freezing only in the relay. Therefore, effects of other electrical components accommodated in the electrical junction box are not sufficiently taken into consideration. That is, a large number of various electrical components other than the relay are accommodated in the electrical junction box, and thus there is a case where a problem of the conduction failure of the contact in the relay due to freezing is likely to occur due to heat generated by the other electrical components.

SUMMARY

The object of exemplary embodiments is to suppress an operational failure of an electrical component accommodated in an electrical junction box.

Exemplary embodiments are directed to an electrical junction box including a casing, and an electrical component that is accommodated in the casing and has an electrical component case and a terminal portion, the terminal portion being accommodated in the electrical component case and having a contact, wherein a small heat amount-generating region that generates a smaller amount of heat than the electrical component does when current flows through the electrical component is formed in the casing, and the electrical component is disposed such that the contact is located on the small heat amount-generating region side.

In a preferred embodiment, the electrical component case located near the contact is disposed on the small heat amount-generating region side. This makes it possible to reduce the temperature of the electrical component case located near the contact. Thus, moisture condenses on the electrical component case before condensing on the contact, and therefore, moisture in the electrical component case hardly condenses and freezes on the contact. As a result, operational failure of the electrical component in the electrical component case can be suppressed.

The following aspects are preferable embodiments.

It is preferable that the casing accommodates an electrical component-mounting board on which the electrical component is mounted, and a small heat amount-generating board that is disposed in the small heat amount-generating region and generates a smaller amount of heat than the electrical component-mounting board does when current flows through the electrical component, and the electrical component is disposed such that the contact is located on the small heat amount-generating board side.

With the above aspect, it is possible to further reduce the temperature of the electrical component case located near the contact, and therefore, moisture in the electrical component case even less likely condenses and freezes on the contact. As a result, operational failure of the electrical component can be further suppressed.

It is preferable that the electrical component-mounting board and the small heat amount-generating board are disposed on substantially the same plane.

With the above aspect, it is possible to reduce a height dimension of the electrical junction box in the direction intersecting the plate surfaces of the electrical component-mounting board and the small heat amount-generating board.

It is preferable that the electrical component-mounting board and the small heat amount-generating board are disposed on different planes.

With the above aspect, it is possible to effectively utilize a space inside the casing and to dispose the electrical component-mounting board and the small heat amount-generating board.

It is preferable that the electrical component-mounting board and the small heat amount-generating board are disposed so that at least portions thereof overlap each other.

With the above aspect, it is possible to reduce the size of the electrical junction box by a length dimension corresponding to the region in which the electrical component-mounting board and the small heat amount-generating board overlap each other.

It is preferable that the casing is provided with an electrical component-side air vent through which the inside and the outside of the casing are in communication with each other at a position near the electrical component.

With the above aspect, it is possible to release heat to the outside of the casing through the electrical component-side air vent formed in the casing, thus making it possible to reduce the temperature of the electrical component case. This makes it possible to further suppress the case where moisture in the electrical component case condenses and freezes on the contact.

It is preferable that the casing is provided with a small heat amount generation-side air vent through which the outside of the casing and the small heat amount-generating region are in communication with each other.

With the above aspect, it is possible to further reduce the temperature of the small heat amount-generating region, thus making it possible to further reduce the temperature of the electrical component case located near the contact. Since moisture in the electrical component case thereby even less likely condenses and freezes on the contact, operational failure of the electrical component can be further suppressed.

It is preferable that the casing has a double wall structure including an inner wall portion and an outer wall portion that is disposed outside the inner wall portion, and a cut-out portion is formed at a position near the electrical component in one of the inner wall portion and the outer wall portion.

With the above aspect, the inside and the outside of the casing are divided by only one of the inner wall portion and the outer wall portion in which no cut-out portion is formed at a position where the cut-out portion is formed and locked. This makes it easier to release heat from the electrical component case to the outside of the casing compared with a case where the double wall structure including the inner wall portion and the outer wall portion. This makes it possible to reduce the temperature of the electrical component case. Thus, it is possible to reduce the difference in temperature between the electrical component case and the terminal portion having the contact, and therefore, moisture in the electrical component case hardly condenses and freezes on the contact. As a result, operational failure of the electrical component can be further suppressed.

A relay is used as the electrical component, and the terminal portion includes, as a contact, at least a fixed contact and a movable contact that can be brought into contact with or separated from the fixed contact.

With the above aspect, moisture in the electrical component case is prevented from condensing and freezing on one or both of the fixed contact and the movable contact included in the terminal portion. The movable contact thereby favorably comes into contact with the fixed contact, thus making it possible to cause the relay to reliably exhibit its switching function.

In accordance with the preferred embodiments, it is possible to suppress an operational failure of an electrical component accommodated in an electrical junction box.

DETAILED DESCRIPTION OF THE EMBODIMENTS

Embodiment 1

Embodiment 1 of the present invention will be described with reference to FIGS. 1 to 6. An electrical junction box 10 of this embodiment is used by being mounted in a vehicle (not shown). The electrical junction box 10 is installed between a battery (not shown) and various vehicle-mounted electrical components (not shown), and conducts or interrupts current to these vehicle-mounted electrical components. This electrical junction box 10 is used by being installed at any position inside an engine room, a compartment, or the like of a vehicle, as needed. It should be noted that specific examples of the vehicle-mounted electrical components include various lamps (including headlights, brake lights, hazard lights (blinker lamps), interior lamps, and the like), air-conditioners, power windows, power steerings, power seats, horns, wipers, defrosters, seat-heaters, starters, engine control units, fuel pumps, and ignitions (ignition devices). Moreover, the X-axis, Y-axis and Z-axis are shown in a certain area of the respective drawings, and the diagrams are drawn so that the axial directions of the diagrams correspond to the directions indicated in the respective drawings. In addition, the upper side shown in FIG. 3 is referred to as a "front side", and the lower side in the same drawing is referred to as a "back side".

Casing 11

Figure 1:
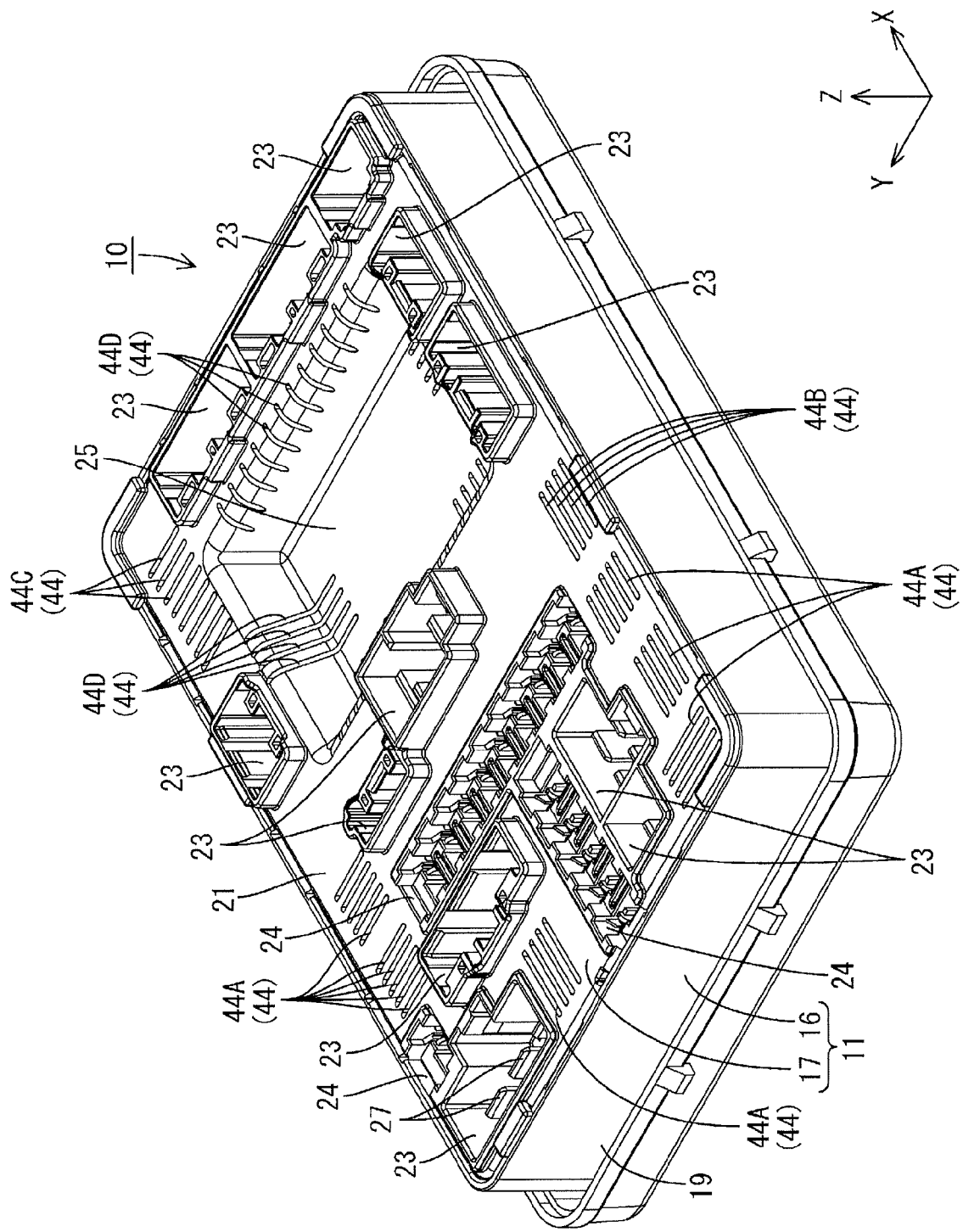
FIG. 1 is a perspective view of an electrical junction box according to Embodiment 1 of the present invention.
Figure 2:
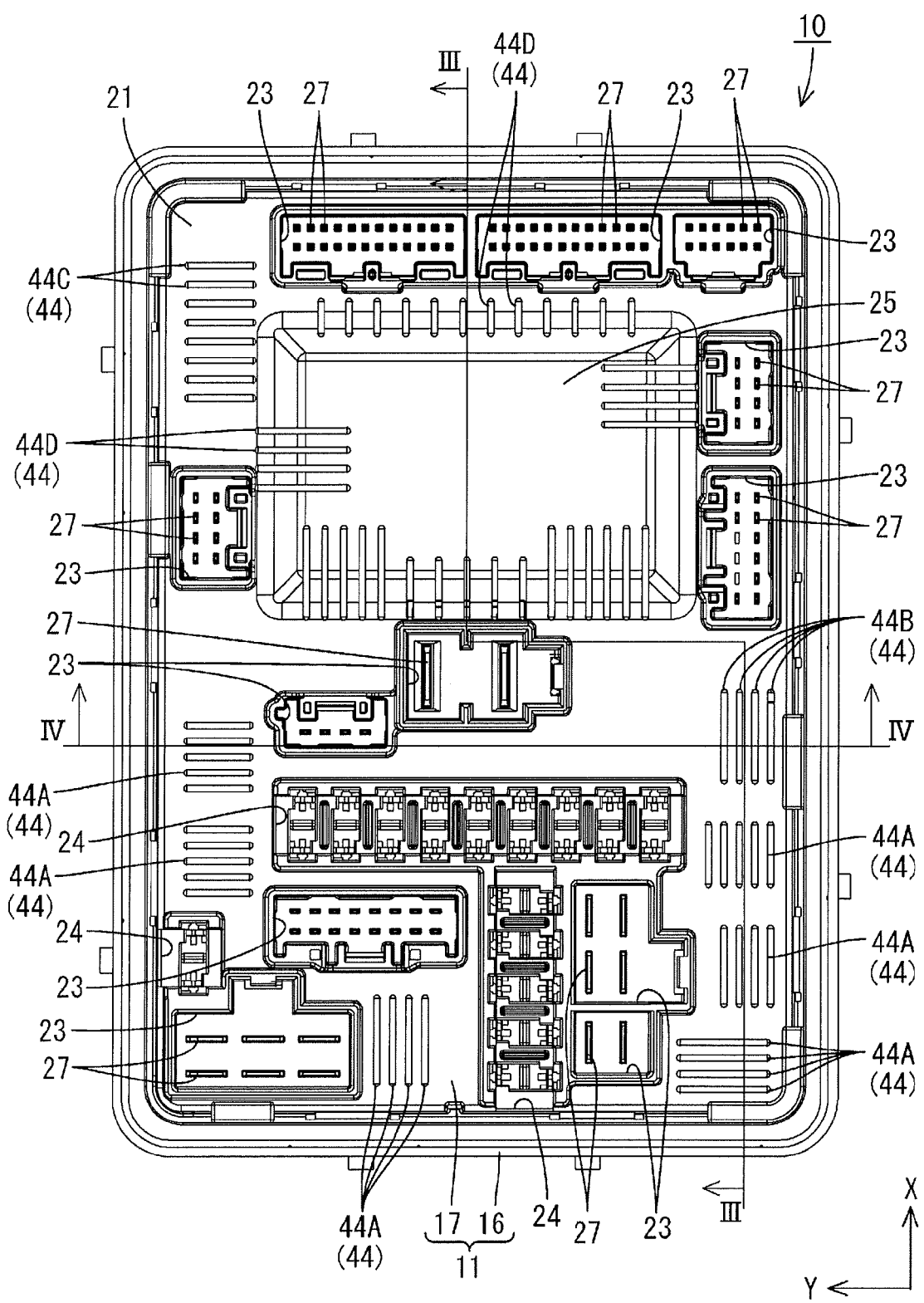
FIG. 2 is a plan view of the electrical junction box according to Embodiment 1.
Figure 3:
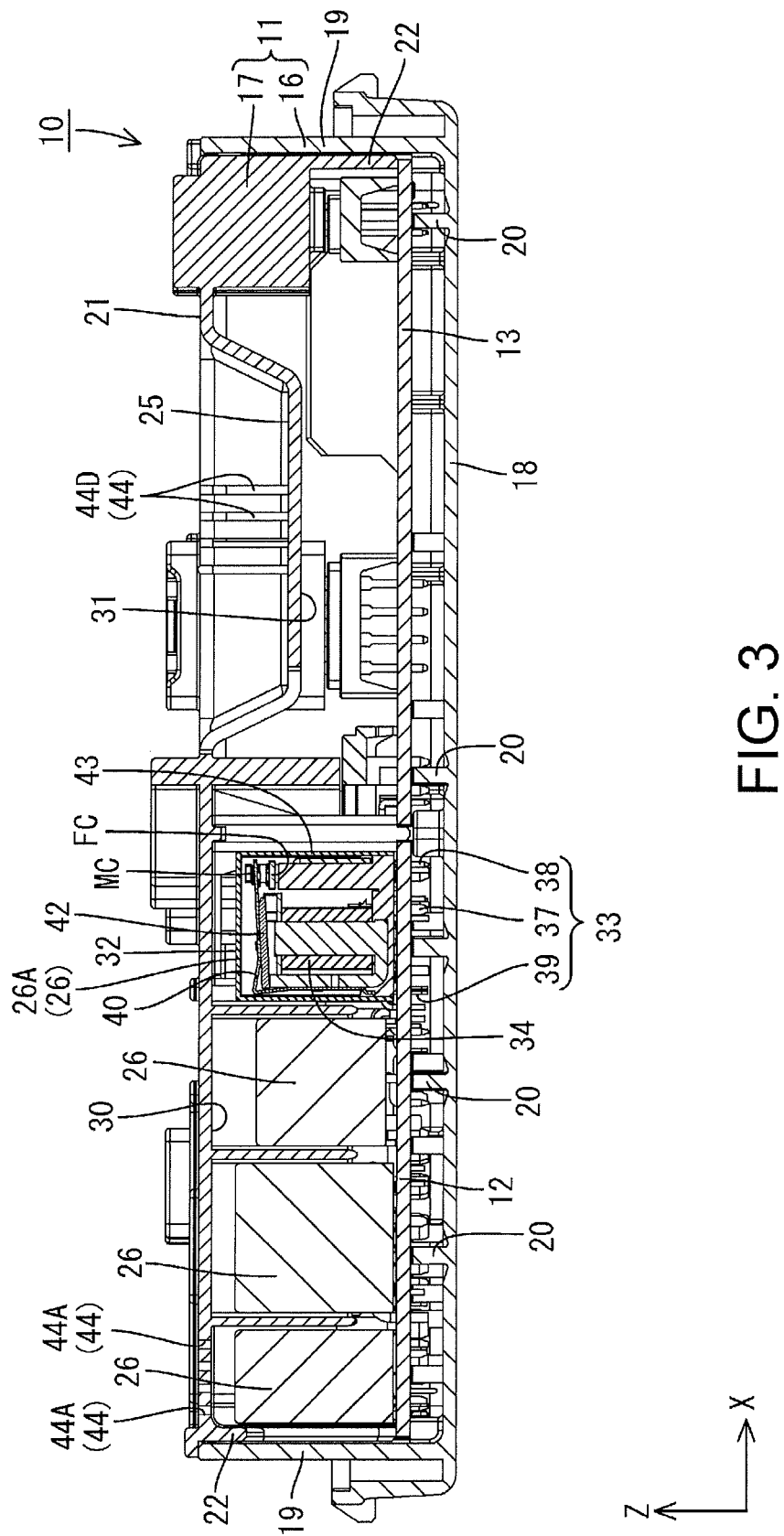
FIG. 3 is a cross-sectional view taken along line III-III in FIG. 2.

As shown in FIGS. 1 and 2, the electrical junction box 10 has a horizontally elongated rectangular shape as a whole. The electrical junction box 10 includes a casing 11, an electrical component-mounting board 12 that is accommodated in the casing 11, and a small heat amount-generating board 13 that is accommodated in the casing 11 and is disposed on substantially the same plane as the plane on which the electrical component-mounting board 12 is disposed (see FIG. 3). The electrical component-mounting board 12 and the small heat amount-generating board 13 are lined up in the direction of the X-axis in the casing 11. As shown in FIG. 1, the electrical junction box 10 is provided with a plurality of connector hood portions 23 to which mating connectors (not shown) provided at the end portions of electrical wires (wire harnesses) are to be fitted and connected, the electrical wires being electrically connected to a battery and the above-described various vehicle-mounted electrical components. Furthermore, the electrical junction box 10 is provided with a plurality of fuse attaching portions 24 that can receive fuses (not shown) and be connected to the fuses. The mating connectors and fuses are inserted from the front side of the electrical junction box 10 in the direction of the Z-axis. Moreover, the longitudinal direction, the short-length direction and the thickness direction of the electrical junction box 10 respectively coincide with the direction of the X-axis, the direction of the Y-axis and the direction of the Z-axis shown in the drawings.

The casing 11 is made of a synthetic resin, and has a rectangular shape in the same manner as the electrical junction box 10 as shown in FIG. 1. The casing 11 is obtained by assembling a first casing member 16 and a second casing member 17 that are a pair of front and back casing members (the upper and the lower casing members shown in FIG. 3). The first casing member 16 (lower case) is disposed on the back side (lower side in the same drawing), whereas the second casing member 17 (upper case) is disposed on the front side (upper side in the same drawing). A space with a predetermined area is ensured inside the casing 11 in a state in which the first casing member 16 and the second casing member 17 are assembled with each other, and the electrical component-mounting board 12 and the small heat amount-generating board 13 can be accommodated in this space. The direction in which the first casing member 16 and the second casing member 17 are assembled with each other coincides with the direction of the Z-axis. The first casing member 16 and the second casing member 17 are assembled with a known locking structure so as to be in one piece.

Figure 4:
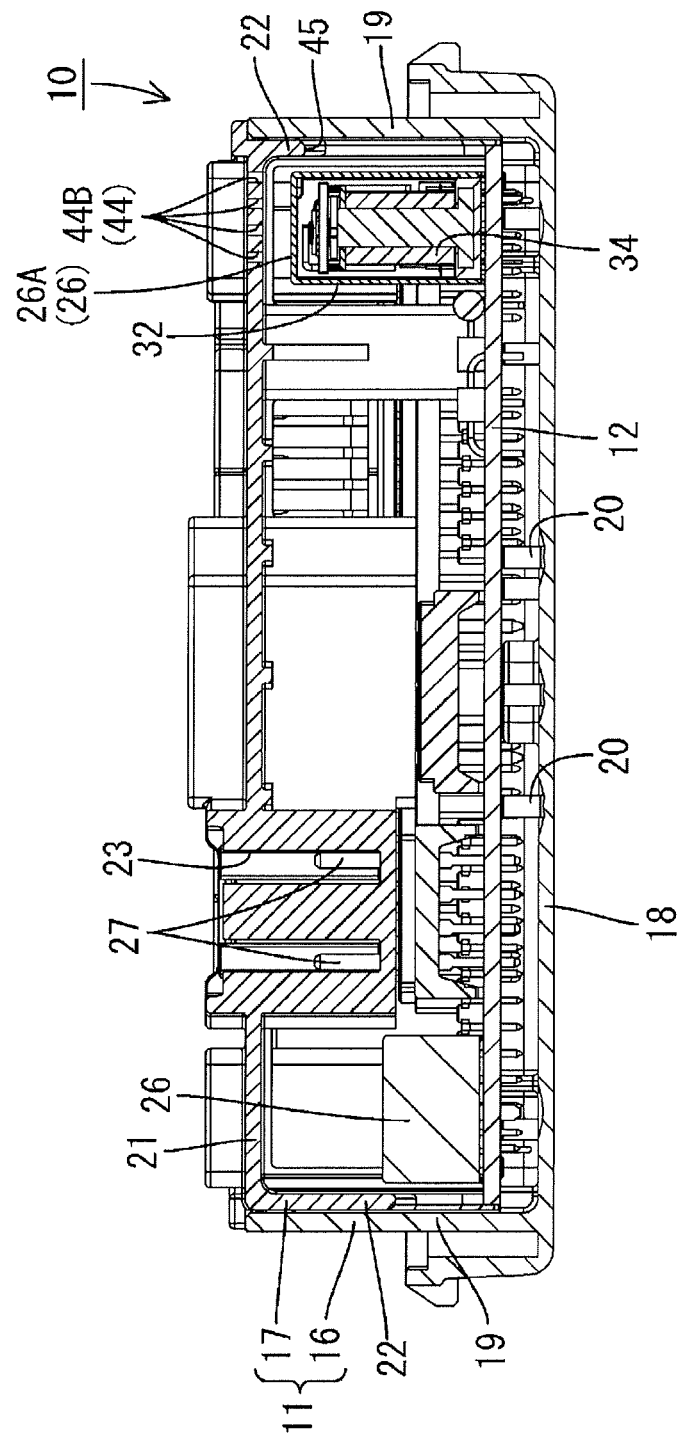
FIG. 4 is a cross-sectional view taken along line IV-IV in FIG. 2.

As shown in FIG. 3, the first casing member 16 has a box shape and is open toward the front side in the direction of the Z-axis (upper side shown in FIG. 3). As shown in FIGS. 3 and 4, the first casing member 16 includes a bottom wall portion 18 that extends in the direction of the X-axis and the direction of the Y-axis (along the plate surface of the electrical component-mounting board 12), and an outer wall portion 19 that rises toward the front side from the outer peripheral end portion of the bottom wall portion 18 in the direction of the Z-axis and has a substantially prismatic tubular shape. The bottom wall portion 18 of the first casing member 16 has a plurality of supporting projections 20 that are distributed on the surface of the bottom wall portion 18 and can support the electrical component-mounting board 12 from the back side.

As shown in FIGS. 3 and 4, the second casing member 17 is substantially box-shaped and is open toward the back side in the direction of the Z-axis (lower side shown in FIG. 4). The second casing member 17 roughly includes an upper wall portion 21 that is opposed to the bottom wall portion 18 of the first casing member 16 and covers the electrical component-mounting board 12 and the small heat amount-generating board 13 from the front side, and an inner wall portion 22 that extends downward to the back side from the outer peripheral end portion of the upper wall portion 21 and has a substantially prismatic tubular shape.

As shown in FIGS. 1 and 2, the upper wall portion 21 is provided with a plurality of connector hood portions 23 and a plurality of fuse attaching portions 24. The connector hood portions 23 each have a substantially prismatic tubular shape and are open toward the front side, and the above-described mating connectors can be fitted thereto from the front side. The fuse attaching portions 24 each have a substantially prismatic tubular shape, are open toward the front side, and have a plurality of fuse attaching spaces to which the above-described fuses can be separately attached from the front side. In addition, the upper wall portion 21 is provided with a recessed portion 25 that is recessed toward the small heat amount-generating board 13 side in the region opposed to the small heat amount-generating board 13.

As shown in FIGS. 3 and 4, the inner wall portion 22 is fitted to the inside of the outer wall portion 19 of the first casing member 16. In other words, the outer wall portion 19 is disposed outside the inner wall portion 22 in the thickness direction. The casing 11 has a double wall structure including the inner wall portion 22 and the outer wall portion 19.

Electrical Component-Mounting Board 12

Figure 5:
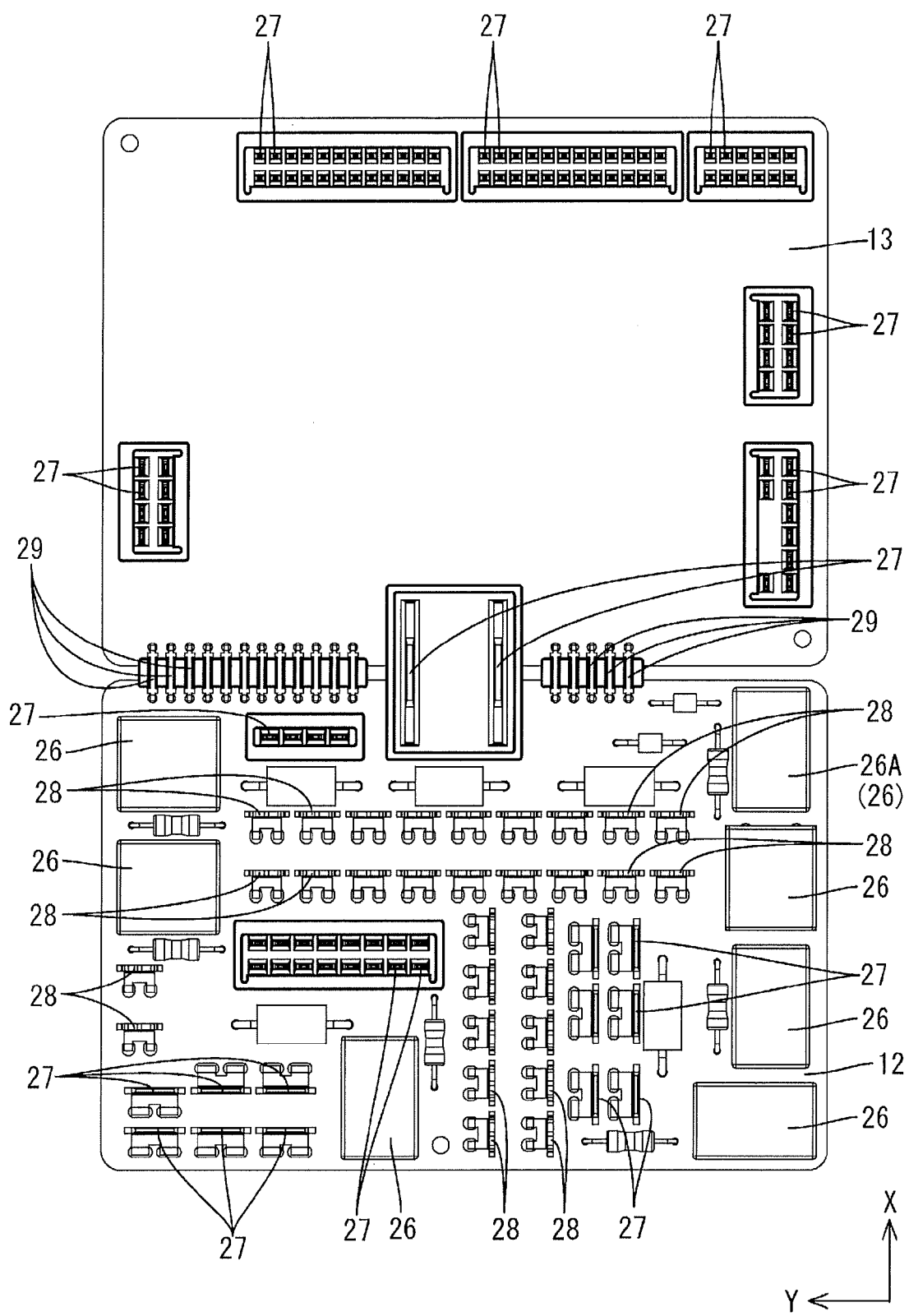
FIG. 5 is a plan view illustrating an electrical component-mounting board and a small heat amount-generating board according to Embodiment 1.

The electrical component-mounting board 12 is made of an insulating synthetic resin and has a substantially rectangular shape as shown in FIG. 5. As shown in FIG. 3, the electrical component-mounting board 12 extends along the plate surface of the bottom wall portion 18 of the first casing member 16, and has a horizontally elongated plate shape and a size over substantially half of the bottom wall portion 18. In this embodiment, the electrical component-mounting board 12 is disposed in a substantially left half region of the bottom wall portion 18 in FIG. 3. Conductive paths (not shown) are formed by printed wiring technology on both or one of the front surface and the back surface of the electrical component-mounting board 12. A plurality of relays 26 is mounted on the plate surface on the front side of the electrical component-mounting board 12. The electrical component-mounting board 12 has conductive paths to be connected to the relays 26, and electric current supplied by a battery flows through those conductive paths. The electrical component-mounting board 12 is, so to speak, a power system circuit board for relaying the power supply from a battery to various vehicle-mounted electrical components. The relays 26 mounted on the electrical component-mounting board 12 conduct or interrupt current from a battery to the various vehicle-mounted electrical components.

As shown in FIG. 5, a plurality of connector terminals 27 to be disposed inside the connector hood portions 23 are mounted on the surface of the electrical component-mounting board 12. The connector terminals 27 are each disposed so as to project toward the front side (the direction of the Z-axis) and have a tab shape. Also, a plurality of fuse connecting terminals 28 to be disposed inside the fuse attaching portions 24 are mounted on the surface of the electrical component-mounting board 12. The fuse connecting terminals 28 are each disposed so as to project toward the front side (the direction of the Z-axis) and have a front end portion having a bifurcating branched shape. As shown in FIG. 5, the connector terminals 27 and the fuse connecting terminals 28 are disposed so as to be concentrated in a substantially central portion of the electrical component-mounting board 12 in the longitudinal direction.

Small Heat Amount-Generating Board 13

The small heat amount-generating board 13 is made of an insulating synthetic resin and has a substantially rectangular shape as shown in FIG. 5. As shown in FIG. 3, the small heat amount-generating board 13 extends along the plate surface of the bottom wall portion 18 of the first casing member 16, and has a horizontally elongated plate shape and a size over substantially half of the bottom wall portion 18. In this embodiment, the small heat amount-generating board 13 is disposed in a substantially right half region of the bottom wall portion 18 in FIG. 3. The above-described electrical component-mounting board 12 and the small heat amount-generating board 13 are disposed on substantially the same plane. A case where the electrical component-mounting board 12 and the small heat amount-generating board 13 are disposed on substantially the same plane includes a case where the electrical component-mounting board 12 and the small heat amount-generating board 13 are disposed on the same plane, and a case where the electrical component-mounting board 12 and the small heat amount-generating board 13 are disposed on different planes and can be evaluated to be disposed on substantially the same plane.

As shown in FIG. 5, the electrical component-mounting board 12 and the small heat amount-generating board 13 are formed so as to have substantially the same length dimension in the direction of the Y-axis, and the small heat amount-generating board 13 is formed so as to be slightly longer in the direction of the X-axis. The electrical component-mounting board 12 and the small heat amount-generating board 13 are electrically connected to each other via a plurality of jumper wires 29. A plurality of connector terminals 27 to be disposed inside the connector hood portions 23 are mounted on the surface of the small heat amount-generating board 13. The connector terminals 27 are each disposed so as to project toward the front side (the direction of the Z-axis) and have a tab shape.

Conductive paths (not shown) are formed by printed wiring technology on both or one of the front surface and the back surface of the small heat amount-generating board 13. Various electronic components such as a semiconductor relay, a semiconductor fuse, a resistance, a capacitor, a transistor, and a microcomputer are electrically connected to the conductive paths on the small heat amount-generating board 13 by known technology such as soldering, which is not specifically shown in the drawings. The small heat amount-generating board 13 includes a so-called control circuit for controlling an operating state (conducting or interrupting current) of the relays 26 and the like mounted on the electrical component-mounting board 12 using the various mounted electronic components. It should be noted that no relays 26 are mounted on the small heat amount-generating board 13.

Relay 26

The relays 26 are electrical components for controlling whether or not power supplied by the battery is supplied to the vehicle-mounted electrical components. The relays 26 are disposed in correspondence to the vehicle-mounted electrical components for which current flow is to be controlled. For example, one relay 26 may be disposed for one vehicle-mounted electrical component, a plurality of relays 26 may be disposed for one vehicle-mounted electrical component, one relay 26 may be disposed for a plurality of vehicle-mounted electrical components, and a plurality of relays 26 may be disposed for a plurality of vehicle-mounted electrical components. When current flows through the relay 26, current also flows through the vehicle-mounted electrical component to be controlled. On the other hand, when no current flows through the relay 26, no current flows through the vehicle-mounted electrical component to be controlled either. As shown in FIG. 5, the relays 26 are disposed at the substantially end portions of the electrical component-mounting board 12.

Figure 6:
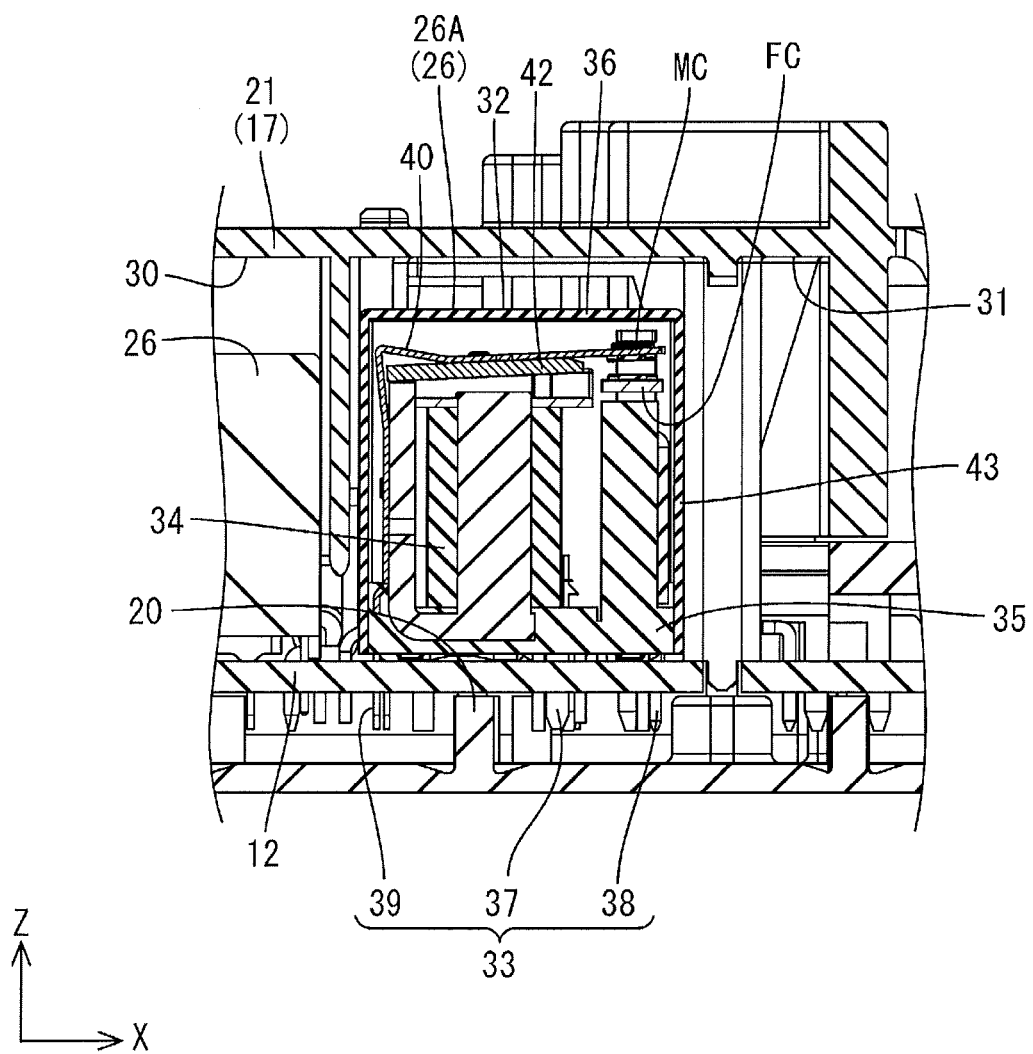
FIG. 6 is a partial enlarged view of FIG. 3.

As shown in FIG. 6, each relay 26 includes a relay case 32 (an example of electrical component cases) made of a synthetic resin, a terminal portion 33 that is made of metal and is attached while penetrating the bottom surface of the relay case 32 so that part thereof projects outward, and a coil 34 that is accommodated in the relay case 32. The relay case 32 has a block shape that is elongated in the direction of the Z-axis as a whole, and has a space for accommodating the terminal portion 33 and the coil 34 thereinside. It should be noted that the relay case 32 includes a base portion 35 having a bottom surface and a cover portion 36 that has a closed-ended tubular shape and covers the base portion 35.

The terminal portion 33 includes a pair of coil terminal portions 37 that are connected to the two end portions of the wound wire of the coil 34 in the relay case 32, a fixed contact terminal portion 38 having a fixed contact FC, and a movable contact terminal portion 39 having a movable contact MC.

The movable contact terminal portion 39 has a terminal body 40 capable of being elastically displaced by the action of the magnetic field of the coil 34, and the movable contact MC provided at the front end portion of the terminal body 40 is brought into contact with and separated from the fixed contact FC of the fixed contact terminal portion 38 with the displacement of the terminal body 40. It should be noted that the terminal body 40 is made of a metal material that has an excellent durability in a portion capable of elastically being displaced, whereas the movable contact MC is made of a metal material that has an excellent conductivity.

A magnetic member 42 made of a magnetic substance is attached to the terminal body 40. The magnetic member 42 is made of a magnetic material such as iron and is disposed so as to be interposed between the terminal body 40 and the coil 34, and the terminal body 40 can be displaced by electromagnetic induction action of the coil 34.

In the above-described relay 26, the fixed contact FC and the movable contact MC are separated from each other so as not to be in contact with each other in a state in which no current flows through the coil 34, and no current flows between the fixed contact terminal portion 38 and the movable contact terminal portion 39. On the other hand, when current flows through the coil 34 via the coil terminal portion 37, the movable contact terminal portion 39 is displaced to bring the movable contact MC thereof into contact with the fixed contact FC with the magnetic member 42 being drawn to the coil 34 side by electromagnetic induction action of the coil 34, and thus current flows between the fixed contact terminal portion 38 and the movable contact terminal portion 39. That is, the relay 26 has a so-called a-contact structure. It should be noted that portions of respective terminal portions 37, 38, and 39 that project from the bottom surface of the relay case 32 are fixed to the electrical component-mounting board 12 by soldering or the like and are electrically connected to the conductive paths.

Arrangement of Relay 26A

As shown in FIG. 3, a relay 26A (an example of an electrical component) is disposed at a position on the right end portion side of the electrical component-mounting board 12 in FIG. 3. The relay 26A is disposed such that the fixed contact FC and the movable contact MC are located on a small heat amount-generating region 31 side, which will be described later.

As shown in FIG. 3, in the casing 11, a region in which the electrical component-mounting board 12 on which the relay 26A is mounted is accommodated (substantially left half region in FIG. 3) serves as a large heat amount-generating region 30 whose temperature becomes relatively high due to heat generated by the relay 26A and the electrical component-mounting board 12 when current flows through the relay 26A. On the other hand, in the casing 11, a region in which the small heat amount-generating board 13 is accommodated (substantially right half region in FIG. 3) serves as the small heat amount-generating region 31 that generates a smaller amount of heat than the relay 26A does when current flows through the relay 26A. The small heat amount-generating board 13 is disposed in the small heat amount-generating region 31. Since no relays 26 and 26A are mounted on the small heat amount-generating board 13, the small heat amount-generating board 13 generates a smaller amount of heat than the electrical component-mounting board 12 does when current flows through the relays 26 and 26A. The above-described recessed portion 25 formed in the upper wall portion 21 is formed at a position corresponding to the small heat amount-generating region 31.

In the relay case 32 of the relay 26A, the fixed contact FC and the movable contact MC of the relay 26A are disposed at positions located on the right end side in FIG. 3. The small heat amount-generating region 31 is formed on the right side of the relay 26A, and the small heat amount-generating board 13 is disposed in the small heat amount-generating region 31. In other words, the relay 26A is configured to be disposed such that the fixed contact FC and the movable contact MC are located on the small heat amount-generating board 13 side. Thus, the temperature of a side wall 43 of the relay case 32 of the relay 26A that is located near the fixed contact FC and the movable contact MC is relatively likely to decrease.

Heat-Releasing Structure

As shown in FIG. 2, the upper wall portion 21 of the second casing member 17 is provided with a plurality of air vents 44 that are formed in an elongated slit shape. The inside and the outside of the casing 11 are in communication with each other through the air vents 44.

The air vents 44 formed in substantially the lower half of the second casing member 17 in FIG. 2 serve as large heat amount generation-side air vents 44A formed at positions corresponding to the large heat amount-generating region 30 in the casing 11. The relays 26 are disposed on the back sides of the large heat amount generation-side air vents 44A (see both FIGS. 2 and 5).

The large heat amount generation-side air vents 44A formed at a position corresponding to the above-described relay 26A serve as electrical component-side air vents 44B. The region near the relay 26A inside the casing 11 and the outside of the casing 11 are in communication with each other through the electrical component-side air vents 44B.

The air vents 44 formed in substantially the upper half of the second casing member 17 in FIG. 2 serve as small heat amount generation-side air vents 44C formed at positions corresponding to the small heat amount-generating region 31 in the casing 11. The small heat amount-generating region 31 and the outside of the casing 11 are in communication with each other through the small heat amount generation-side air vents 44C.

The small heat amount generation-side air vents 44C formed in the recessed portion 25 serve as recessed portion air vents 44D. As shown in FIG. 3, the recessed portion 25 is formed so as to be recessed toward the small heat amount-generating region 31 side, and thus is formed in a state in which the recessed portion 25 is closer to the small heat amount-generating board 13 than other portions are. The recessed portion 25 is provided with the recessed portion air vents 44D, and thus heat generated by the small heat amount-generating region 31 or the small heat amount-generating board 13 is rapidly transferred to the outside of the casing 11.

As shown in FIG. 4, a cut-out portion 45 is formed at a position corresponding to the relay 26A in the inner wall portion 22 of the second casing member 17 by cutting out the inner wall portion 22. In this embodiment, the cut-out portion 45 is formed in the inner wall portion 22 located on the right side of the relay 26A in FIG. 4. Since the cut-out portion 45 is formed, the inside and the outside of the casing 11 near the relay 26A are divided by only the outer wall portion 19 of the first casing member 16.

Action and Effect of this Embodiment

Next, action and effect of this embodiment will be described. When a vehicle is started, a user operates an ignition key or an ignition switch (not shown) mounted in the vehicle. Then, a signal is transmitted to the small heat amount-generating board 13, and the signal is transmitted to the electrical component-mounting board 12 via the jumper wires 29. Then, current flows through the vehicle-mounted electrical components, such as a starter, to be controlled by the relay 26A. Thus the engine, the motor, and the like mounted in the vehicle are started, and the vehicle is ready to be driven. The vehicle is in operation in this manner. Current flow through the relays 26 and 26A is controlled by transmitting a predetermined signal from the small heat amount-generating board 13 via the jumper wires 29 to the electrical component-mounting board 12 in accordance with the user's operation.

When current flows through the vehicle-mounted electrical components (e.g., various lamps, air-conditioners, power windows, power steerings, power seats, horns, wipers, defrosters, and seat-heaters), the electrical component-mounting board 12 and the small heat amount-generating board 13 generate heat with the current flow, and the amount of the generated heat tends to be in proportion to the total current flow time and the amount of the flowing current. The relay 26A is mounted on the electrical component-mounting board 12, and therefore, when current flows through the relay 26A, not only the relay 26A but also the electrical component-mounting board 12 generate heat. Thus there is a case where moisture is evaporated inside the relay case 32 of the relay 26A, making the inside of the relay case 32 hot and humid.

On the other hand, no relays 26 and 26A are mounted on the small heat amount-generating board 13, and therefore, the amount of heat generated by the small heat amount-generating board 13 is smaller than that generated by the electrical component-mounting board 12.

Incidentally, when the engine, the motor, or the like is stopped under a relatively low-temperature environment and the vehicle operation is stopped, no current flows through the relay 26A. Then, the relay 26A is allowed to cool. Since terminal portions 33 of the relay 26A that has the fixed contact FC and the movable contact MC are made of a metal material having a larger thermal conductivity than a resin material making up the relay case 32 does, and are further connected to the circuit pattern of the electrical component-mounting board 12 that is made of a metal material to exhibit heat sink action at a low temperature, the decrease in the temperature of the relay 26A is likely to be promoted. Therefore, the temperature of the relay case 32 becomes relatively high and the temperatures of the terminal portions 33 having the fixed contact FC and the movable contact MC become relatively low, and thus the difference in temperature between the relay case 32 and the terminal portions 33 is likely to become large. In particular, the temperature of the fixed contact terminal portion 38 having the fixed contact FC is likely to decrease compared with a case where the movable contact terminal portion 39 having the movable contact MC has the magnetic member 42 brought into contact with the coil 34 and thus the temperature thereof tends to increase due to heat transmitted from the coil 34.

As described above, there is a case where moisture evaporated due to heat generated during current flow exists inside the relay case 32. Therefore, when the difference in temperature between the fixed contact terminal portion 38 having the fixed contact FC and the relay case 32 becomes large, there is a risk that dew condensation is likely to occur selectively on the fixed contact FC of the fixed contact terminal portion 38 and the condensed dew freezes under a low-temperature environment. In such a case, when an attempt is made to start the vehicle again, there is a risk that the vehicle cannot be started because the fixed contact FC and the movable contact MC of the terminal portions 33 cannot be in contact with each other to cause an operational failure of the relay 26A, thus making it impossible to start the engine, for example.

In light of the above-described problems, in this embodiment, the small heat amount-generating region 31 that generates a smaller amount of heat than the relay 26A does when current flows through the relay 26A is formed inside the casing 11, and the relay 26A is disposed such that the fixed contact FC and the movable contact MC are located on the small heat amount-generating region 31 side.

Since the small heat amount-generating region 31 is formed inside the casing 11 as described above, the temperature of the small heat amount-generating region 31 becomes lower than those of the relay 26A and the electrical component-mounting board 12 inside the casing 11. Thus the side wall 43 of the relay 26A that is located on the small heat amount-generating region 31 side is rapidly cooled. Then, water vapor inside the relay case 32 condenses on the inner surface of the side wall 43 before condensing on the fixed contact FC and the movable contact MC. Thus the humidity in the region near the side wall 43 decreases. As a result, the humidity near the fixed contact FC and the movable contact MC that are disposed on the small heat amount-generating region 31 side in the relay case 32 decreases, and therefore, moisture hardly condenses and freezes on the fixed contact FC and the movable contact MC. As a result, operational failure of the relay 26A can be suppressed.

Moreover, in this embodiment, the casing 11 accommodates the electrical component-mounting board 12 on which the relay 26A is mounted, and the small heat amount-generating board 13 that is disposed in the small heat amount-generating region 31 and generates a smaller amount of heat than the electrical component-mounting board 12 does when current flows through the relay 26A, and the relay 26A is disposed such that the fixed contact FC and the movable contact MC are located on the small heat amount-generating board 13 side.

This makes it possible to further reduce the temperature of the side wall 43 of the relay case 32 that is located near the fixed contact FC and the movable contact MC, and therefore, moisture in the relay case 32 even less likely condenses and freezes on the fixed contact FC and the movable contact MC. As a result, operational failure of the relay 26A can be further suppressed.

Moreover, in this embodiment, the casing 11 is provided with the electrical component-side air vents 44B through which the inside and the outside of the casing 11 are in communication with each other at positions near the relay 26A. This makes it possible to release heat in the relay case 32 to the outside of the casing 11 through the electrical component-side air vents 44B formed in the casing 11, and therefore, the temperature of the relay case 32 can be reduced. This makes it possible to further suppress the case where moisture in the relay case 32 condenses and freezes on the fixed contact FC and the movable contact MC.

Furthermore, in this embodiment, the large heat amount generation-side air vents 44A are formed also at positions near the relays 26 different from the relay 26A. This makes it possible to release heat generated by the relays 26 when current flows through the relays 26 to the outside of the casing 11 through the large heat amount generation-side air vents 44A. This makes it possible to reduce the temperature of the large heat amount-generating region 30, and therefore, the temperature of the relay case 32 of the relay 26A can be further reduced. As a result, the difference in temperature between the relay case 32 and the fixed contact FC and movable contact MC can be reduced, it is possible to further suppress the case where moisture in the relay case 32 condenses and freezes on the fixed contact FC and the movable contact MC. This makes it possible to further suppress operational failure of the relay 26A.

Moreover, in this embodiment, the casing 11 is provided with the small heat amount generation-side air vents 44C through which the outside of the casing 11 and the small heat amount-generating region 31 is in communication with each other. This makes it possible to further reduce the temperature of the small heat amount-generating region 31, and therefore, it is possible to further reduce the temperature of the side wall 43 of the relay case 32 that is located near the fixed contact FC and the movable contact MC. Thus moisture in the relay case 32 even less likely condenses and freezes on the fixed contact FC and the movable contact MC, and therefore, operational failure of the relay 26A can be further suppressed.

Moreover, in this embodiment, the casing 11 has a double wall structure including the inner wall portion 22 and the outer wall portion 19 disposed outside the inner wall portion 22, and the cut-out portion 45 is formed at a position near the relay 26A in one of the inner wall portion 22 and the outer wall portion 19.

Thus the inside and the outside of the casing 11 are divided by only one of the inner wall portion 22 and the outer wall portion 19 in which no cut-out portion is formed at a position in which the cut-out portion 45 is locked. This makes it easier to release heat from the relay case 32 to the outside of the casing 11 compared with a case where the double wall structure including the inner wall portion 22 and the outer wall portion 19. This makes it possible to reduce the temperature of the relay case 32. Thus, it is possible to reduce the difference in temperature between the relay case 32 and the terminal portion 33 having the fixed contact FC and the movable contact MC, and therefore, moisture in the relay case 32 hardly condenses and freezes on the fixed contact FC and the movable contact MC. As a result, operational failure of the relay 26A can be further suppressed.

Moreover, in this embodiment, the electrical component-mounting board 12 and the small heat amount-generating board 13 are disposed on substantially the same plane. This makes it possible to reduce a height dimension of the electrical junction box 10 in the direction intersecting the plate surfaces of the electrical component-mounting board 12 and the small heat amount-generating board 13.

Moreover, in this embodiment, the relay 26A is used as the electrical component, and the terminal portion 33 includes, as contacts, at least the fixed contact FC and the movable contact MC that is brought into contact with or is separated from the fixed contact FC. Thus moisture in the relay case 32 is prevented from condensing and freezing on one or both of the fixed contact FC and the movable contact MC included in the terminal portion 33. The movable contact MC thereby favorably comes into contact with the fixed contact FC, thus making it possible to cause the relay 26A to reliably exhibit its switching function.

Embodiment 2

Figure 7:
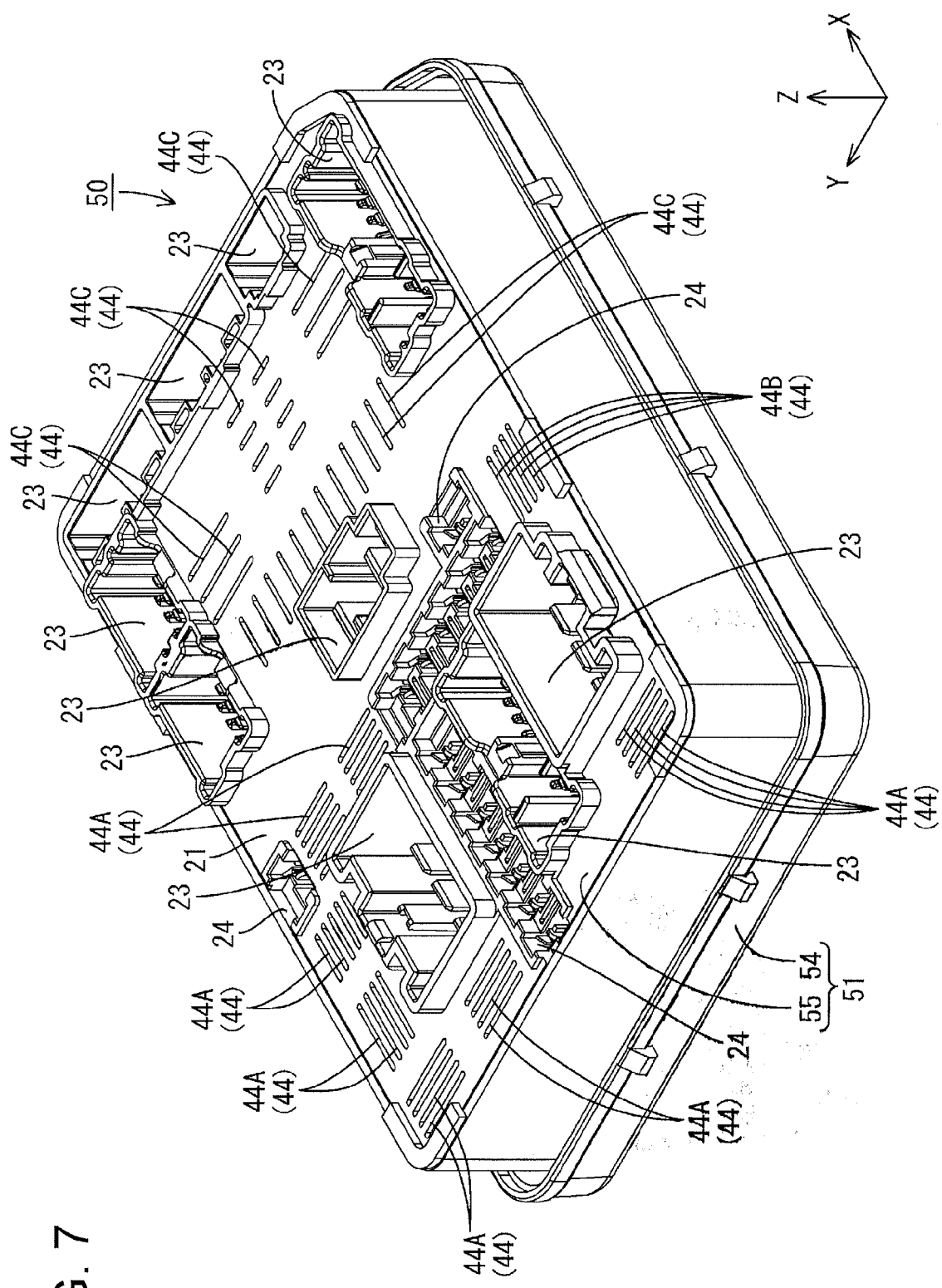
FIG. 7 is a perspective view of an electrical junction box according to Embodiment 2.
Figure 8:
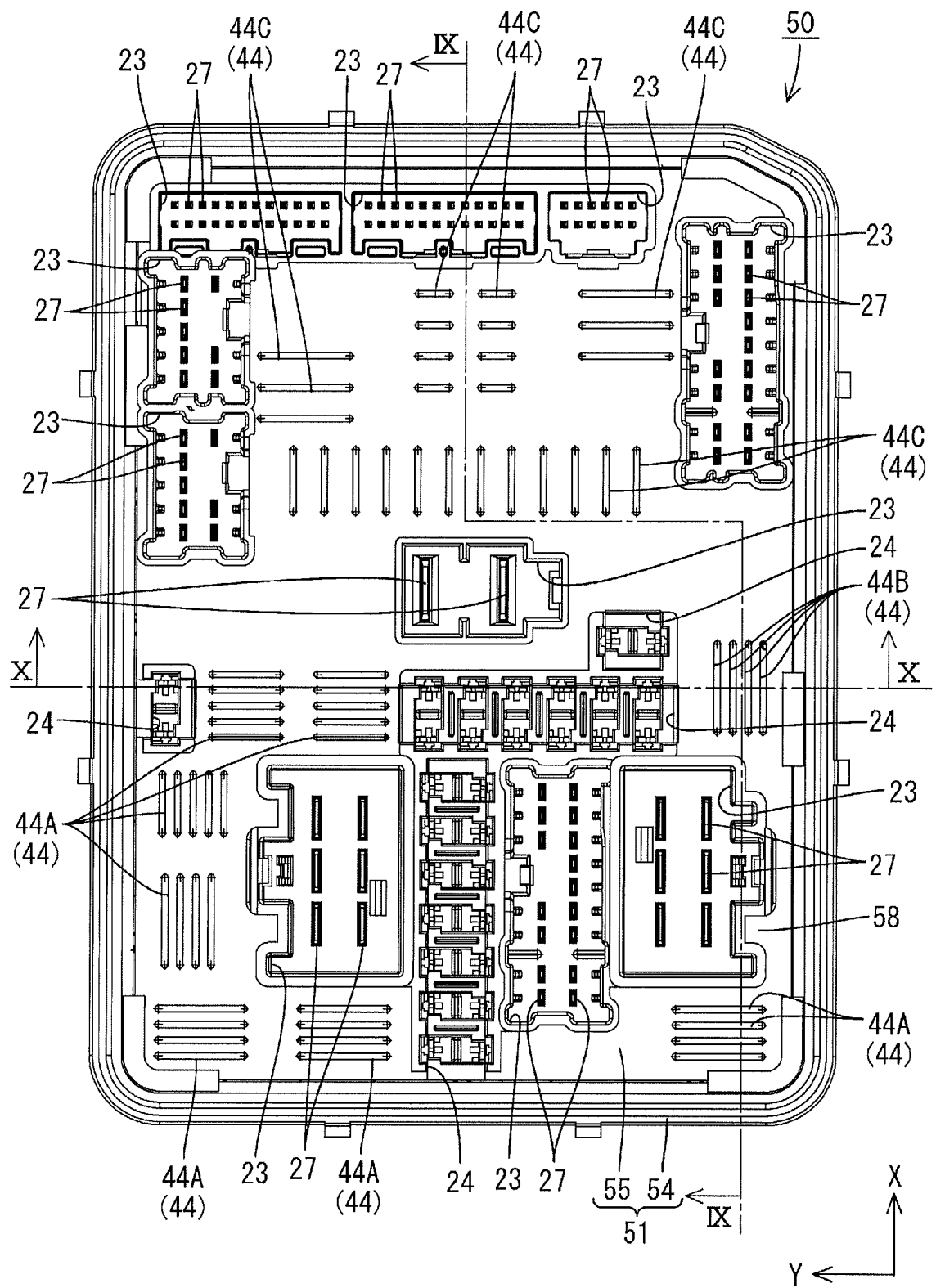
FIG. 8 is a plan view of the electrical junction box according to Embodiment 2.

Next, Embodiment 2 of the present invention will be described with reference to FIGS. 7 to 10. As shown in FIGS. 7 and 8, an electrical junction box 50 has a horizontally elongated rectangular shape as a whole. The electrical junction box 50 includes a casing 51, an electrical component-mounting board 52 that is accommodated in the casing 51, and a small heat amount-generating board 53 that is accommodated in the casing 51 and is disposed on a plane different from the plane on which the electrical component-mounting board 52 is disposed (see FIGS. 9 and 10).

Casing 51

Figure 9:
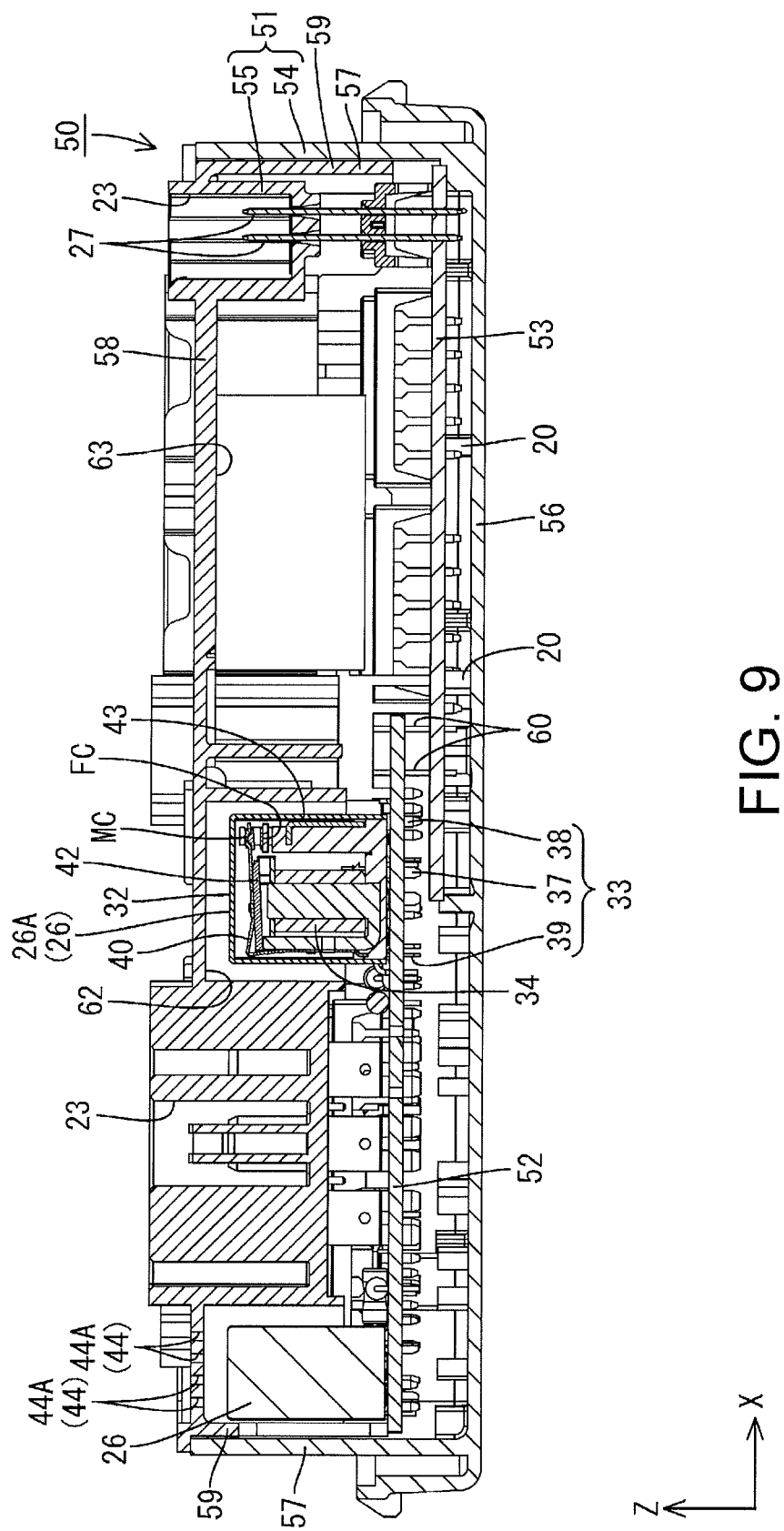
FIG. 9 is a cross-sectional view taken along line IX-IX in FIG. 8.

The casing 51 is made of a synthetic resin, and is obtained by assembling a first casing member 54 and a second casing member 55 that are a pair of front and back casing members (the upper and the lower casing members shown in FIG. 9) as shown in FIG. 9. The first casing member 54 (lower case) is disposed on the back side (lower side in the same drawing), whereas the second casing member 55 (upper case) is disposed on the front side (upper side in the same drawing).

Figure 10:
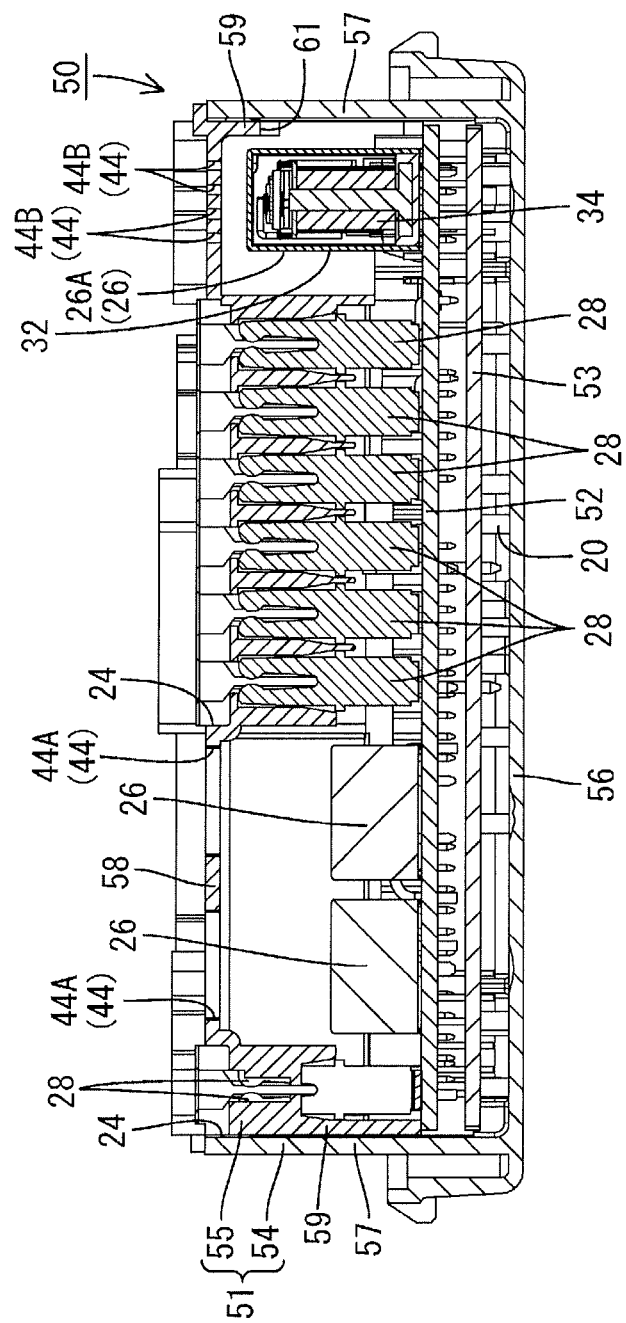
FIG. 10 is a cross-sectional view taken along line X-X in FIG. 8.

As shown in FIG. 9, the first casing member 54 has a box shape and is open toward the front side in the direction of the Z-axis (upper side shown in FIG. 9). As shown in FIGS. 9 and 10, the first casing member 54 includes a bottom wall portion 56 that extends in the direction of the X-axis and the direction of the Y-axis (along the plate surface of the electrical component-mounting board 52), and an outer wall portion 57 that rises toward the front side from the outer peripheral end portion of the bottom wall portion 56 in the direction of the Z-axis and has a substantially prismatic tubular shape.

As shown in FIGS. 9 and 10, the second casing member 55 is substantially box-shaped and is open toward the back side in the direction of the Z-axis (lower side shown in FIG. 10). The second casing member 55 roughly includes an upper wall portion 58 that is opposed to the bottom wall portion 56 of the first casing member 54 and covers the electrical component-mounting board 52 and the small heat amount-generating board 53 from the front side, and an inner wall portion 59 that extends downward to the back side from the outer peripheral end portion of the upper wall portion 58 and has a substantially prismatic tubular shape. In this embodiment, a region of the upper wall portion 58 corresponding to the small heat amount-generating region 31 is not recessed toward the small heat amount-generating board 53 side.

As shown in FIGS. 9 and 10, the inner wall portion 59 is fitted to the inside of the outer wall portion 57 of the first casing member 54. In other words, the outer wall portion 57 is disposed outside the inner wall portion 59 in the thickness direction. The casing 51 has a double wall structure including the inner wall portion 59 and the outer wall portion 57.

Small Heat Amount-Generating Board 53

As shown in FIG. 9, the small heat amount-generating board 53 extends along the plate surface of the bottom wall portion 56 of the first casing member 54, and has a horizontally elongated plate shape and a size over substantially half of the bottom wall portion 56. In this embodiment, the small heat amount-generating board 53 is disposed in a substantially right half region of the bottom wall portion 56 in FIG. 9.

Electrical Component-Mounting Board 52

As shown in FIG. 9, the electrical component-mounting board 52 is disposed so as to be slightly separated from the plate surface of the bottom wall portion 56 of the first casing member 54, and has a horizontally elongated plate shape and a size over substantially half of the bottom wall portion 56. In this embodiment, the electrical component-mounting board 52 is disposed in a substantially left half region of the bottom wall portion 56 in FIG. 9. In this embodiment, the electrical component-mounting board 52 and the small heat amount-generating board 53 are disposed on different planes with a predetermined gap therebetween. In addition, the electrical component-mounting board 52 and the small heat amount-generating board 53 are disposed substantially in parallel with each other.

The right end portion of the electrical component-mounting board 52 in FIG. 9 is disposed so as to overlap the left end portion of the small heat amount-generating board 53 in FIG. 9 in the direction of the Z-axis. In this embodiment, the small heat amount-generating board 53 is disposed so as to be located on the back side of the electrical component-mounting board 52 in the direction of the Z-axis.

The electrical component-mounting board 52 and the small heat amount-generating board 53 are electrically connected to each other with a plurality of relay terminals 60 in the region where the electrical component-mounting board 52 and the small heat amount-generating board 53 overlap each other. The relay terminals 60 are each made of metal that has a rod shape and extends in the front-to-back direction. One end portion of each relay terminal 60 penetrates the electrical component-mounting board 52 and is electrically connected to the conductive path on the electrical component-mounting board 52 by a known method such as soldering. Also, the other end portion of each relay terminal 60 penetrates the small heat amount-generating board 53 and is electrically connected to the conductive path on the small heat amount-generating board 53 by a known method such as soldering.

Arrangement of Relay 26A

As shown in FIG. 9, in this embodiment, the relay 26A is disposed on the surface of the electrical component-mounting board 52 at a position located slightly to the left from the right end portion in FIG. 9 in order to prevent interference with the relay terminals 60. The relay 26A is disposed such that the fixed contact FC and the movable contact MC are located on a small heat amount-generating region 63 side, which will be described later.

As shown in FIG. 9, in the casing 51, a region in which the electrical component-mounting board 52 on which the relay 26A is mounted is accommodated (substantially left half region in FIG. 9) serves as a large heat amount-generating region 62 whose temperature becomes relatively high due to heat generated by the relay 26A and the electrical component-mounting board 12 when current flows through the relay 26A. On the other hand, in the casing 51, a region in which the small heat amount-generating board 53 is accommodated (substantially right half region in FIG. 9) serves as the small heat amount-generating region 63 that generates a smaller amount of heat than the relay 26A does when current flows through the relay 26A. The small heat amount-generating board 53 is disposed in the small heat amount-generating region 63. Since no relays 26 and 26A are mounted on the small heat amount-generating board 53, the small heat amount-generating board 13 generates a smaller amount of heat than the electrical component-mounting board 52 does when current flows through the relays 26 and 26A.

In the relay case 32 of the relay 26A, the fixed contact FC and the movable contact MC of the relay 26A are disposed at positions located on the right end side in FIG. 9. The small heat amount-generating region 63 is formed on the right side of the relay 26A, and the small heat amount-generating board 53 is disposed in the small heat amount-generating region 63. In other words, the relay 26A is configured to be disposed such that the fixed contact FC and the movable contact MC are located on the small heat amount-generating board 53 side. Thus, the temperature of the side wall 43 of the relay case 32 of the relay 26A that is located near the fixed contact FC and the movable contact MC is relatively likely to decrease.

Heat-Releasing Structure

As shown in FIG. 10, a cut-out portion 61 is formed at a position corresponding to the relay 26A in the inner wall portion 59 of the second casing member 55 by cutting out the inner wall portion 59. In this embodiment, the cut-out portion 61 is formed in the inner wall portion 59 located on the right side of the relay 26A in FIG. 10. Since the cut-out portion 61 is formed, the inside and the outside of the casing 51 near the relay 26A are divided by only the outer wall portion 57 of the first casing member 54.

Since configurations other than the above-described configurations are substantially the same as those of Embodiment 1, the same members are denoted by the same reference numerals, and redundant descriptions are omitted.

With this embodiment, the electrical component-mounting board 52 and the small heat amount-generating board 53 are disposed on different planes. This makes it possible to effectively utilize a space inside the casing 51 and to dispose the electrical component-mounting board 52 and the small heat amount-generating board 53.

Furthermore, with this embodiment, the electrical component-mounting board 52 and the small heat amount-generating board 53 are disposed so that at least portions thereof overlap each other. This makes it possible to reduce the size of the electrical junction box 50 by a length dimension corresponding to the region in which the electrical component-mounting board 52 and the small heat amount-generating board 53 overlap each other.

Embodiment 3

Figure 11:
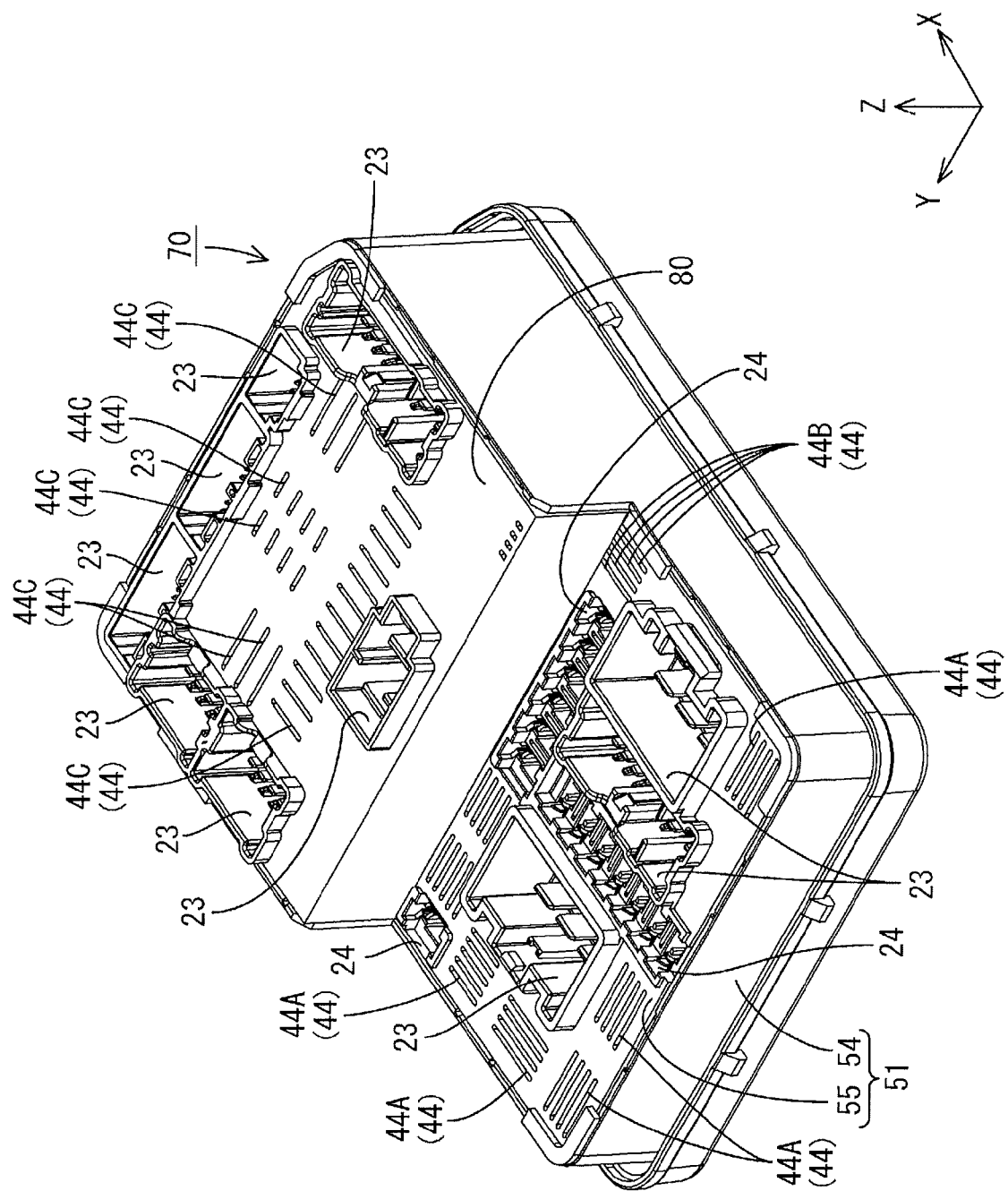
FIG. 11 is a perspective view of an electrical junction box according to Embodiment 3 of the present invention.
Figure 12:
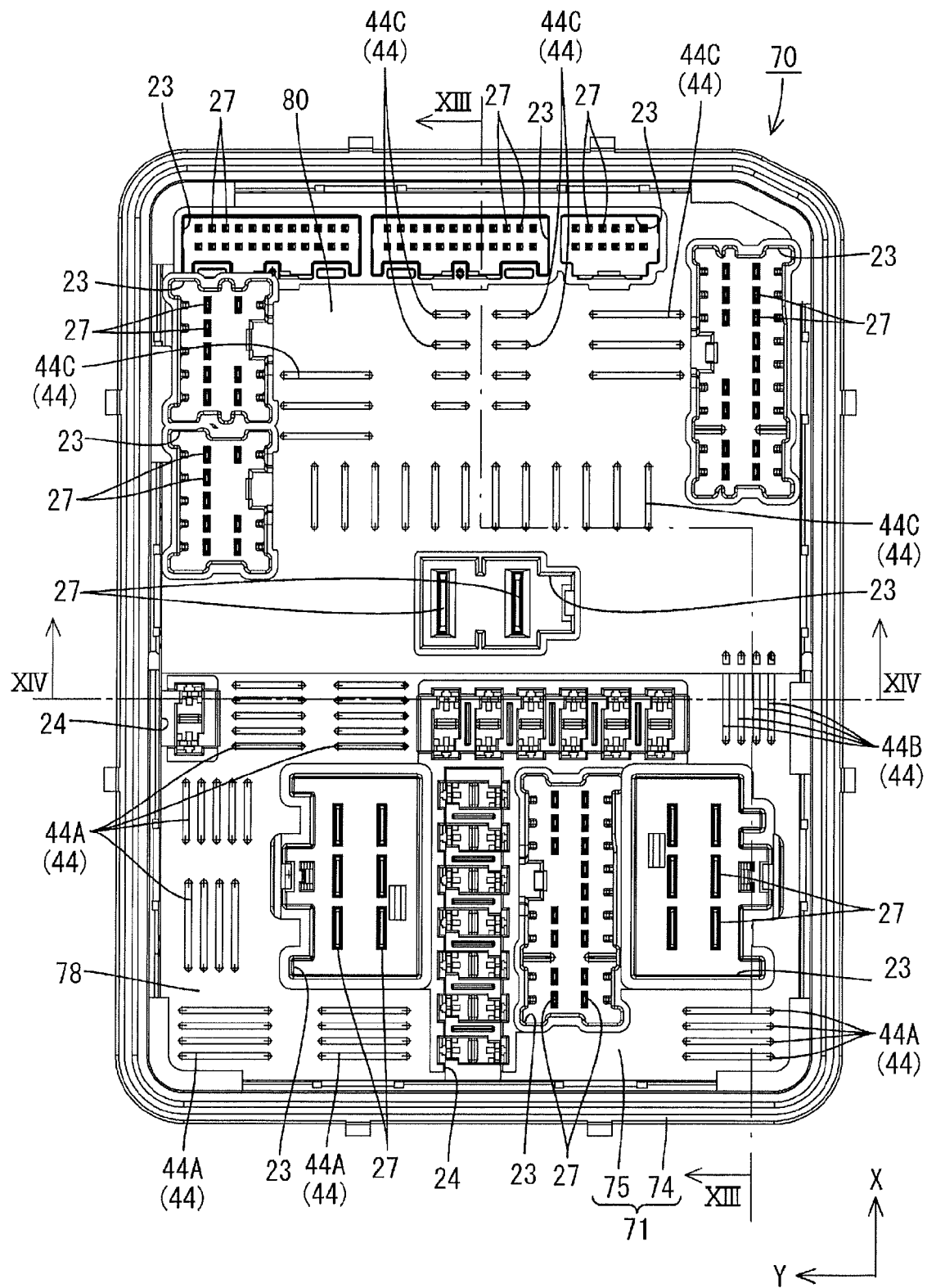
FIG. 12 is a plan view of the electrical junction box according to Embodiment 3.

Next, Embodiment 3 of the present invention will be described with reference to FIGS. 11 to 14. As shown in FIGS. 11 and 12, an electrical junction box 70 according to this embodiment includes a casing 71, an electrical component-mounting board 72 that is accommodated in the casing 71, and a small heat amount-generating board 73 that is accommodated in the casing 71 and is disposed on a plane different from the plane on which the electrical component-mounting board 72 is disposed.

Casing 71

Figure 13:
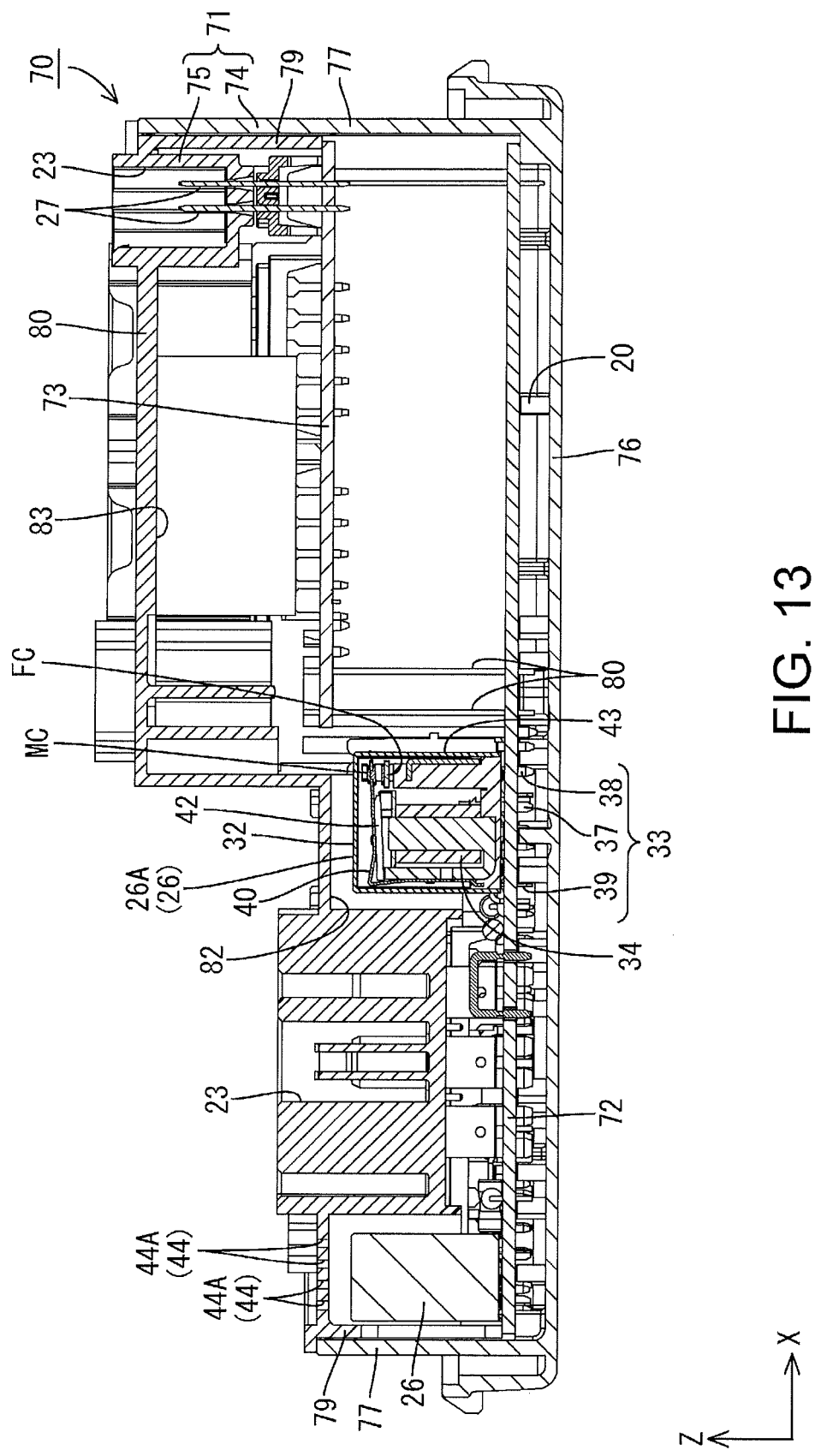
FIG. 13 is a cross-sectional view taken along line XIII-XIII in FIG. 12.

The casing 71 is made of a synthetic resin, and is obtained by assembling a first casing member 74 and a second casing member 75 that are a pair of front and back casing members (the upper and the lower casing members shown in FIG. 13) as shown in FIG. 13. The first casing member 74 (lower case) is disposed on the back side (lower side in the same drawing), whereas the second casing member 75 (upper case) is disposed on the front side (upper side in the same drawing).

Figure 14:
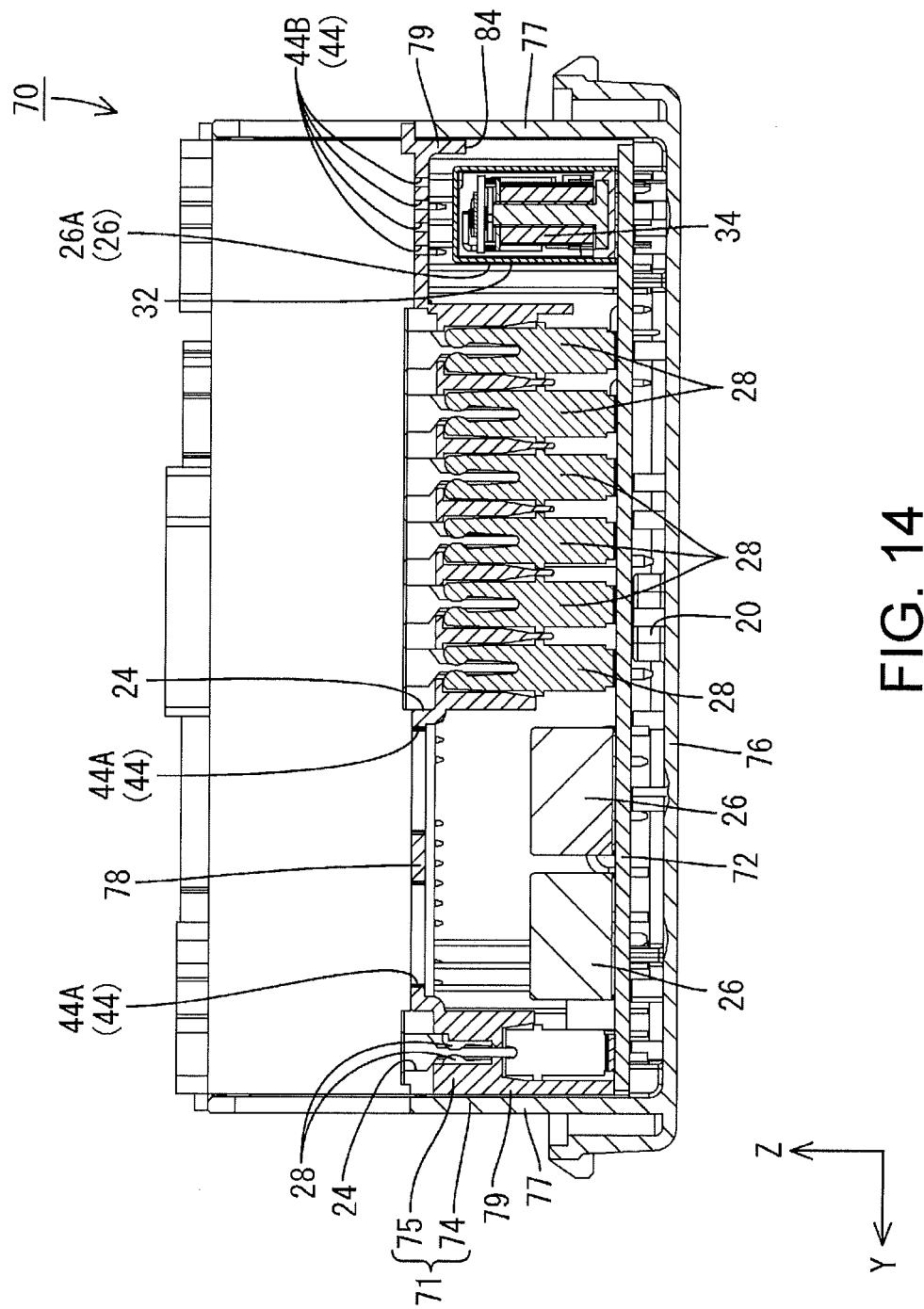
FIG. 14 is a cross-sectional view taken along line XIV-XIV in FIG. 12.

As shown in FIG. 13, the first casing member 74 has a box shape and is open toward the front side in the direction of the Z-axis (upper side shown in FIG. 13). As shown in FIGS. 13 and 14, the first casing member 74 includes a bottom wall portion 76 that extends in the direction of the X-axis and the direction of the Y-axis (along the plate surface of the electrical component-mounting board 72), and an outer wall portion 77 that rises toward the front side from the outer peripheral end portion of the bottom wall portion 76 in the direction of the Z-axis and has a substantially prismatic tubular shape.

As shown in FIGS. 13 and 14, the second casing member 75 is substantially box-shaped and is open toward the back side in the direction of the Z-axis (lower side shown in FIG. 10). The second casing member 75 roughly includes an upper wall portion 78 that is opposed to the bottom wall portion 76 of the first casing member 54 and covers the electrical component-mounting board 72 and the small heat amount-generating board 73 from the front side, and an inner wall portion 79 that extends downward to the back side from the outer peripheral end portion of the upper wall portion 78 and has a substantially prismatic tubular shape.

In this embodiment, an expanded portion 80 that is one level higher toward the front side than other portions is formed at one end portion (upper end portion in FIG. 12) of the upper wall portion 78 in the longitudinal direction (the direction of the X-axis). As shown in FIG. 13, the small heat amount-generating board 73 is accommodated in the expanded portion 80.

As shown in FIGS. 13 and 14, the inner wall portion 79 is fitted to the inside of the outer wall portion 77 of the first casing member 74. In other words, the outer wall portion 77 is disposed outside the inner wall portion 79 in the thickness direction. The casing 71 has a double wall structure including the inner wall portion 79 and the outer wall portion 77.

Small Heat Amount-Generating Board 73

As shown in FIG. 13, the small heat amount-generating board 73 is disposed at a position separated from the bottom wall portion 76 of the first casing member 74, and has a horizontally elongated plate shape and a size over substantially half of the bottom wall portion 76. In this embodiment, the small heat amount-generating board 73 is disposed in a substantially right half region of the bottom wall portion 56 in FIG. 13.

Electrical Component-Mounting Board 72

As shown in FIG. 13, the electrical component-mounting board 72 extends along the plate surface of the bottom wall portion 56 of the first casing member 54, and has a horizontally elongated plate shape and a size over substantially the entire bottom wall portion 76.

In this embodiment, the electrical component-mounting board 72 and the small heat amount-generating board 73 are disposed on different planes with a predetermined gap therebetween. In addition, the electrical component-mounting board 72 and the small heat amount-generating board 73 are disposed substantially in parallel with each other. In other words, the small heat amount-generating board 73 is disposed so as to overlap right half of the electrical component-mounting board 72 on the front side in the direction of the Z-axis in FIG. 13.

As shown in FIG. 13, one end portion of each of the relay terminals 81 penetrates the small heat amount-generating board 73 at a position located on the right end portion side in FIG. 13. The one end portion of each of the relay terminals 81 is electrically connected to the conductive path on the small heat amount-generating board 73 by a known method such as soldering. The other end portion of each of the relay terminals 81 extends toward the back side in the direction of the Z-axis, and penetrates the electrical component-mounting board 72. The other end portion of each of the relay terminals 81 is electrically connected to the conductive path on the electrical component-mounting board 72 by a known method such as soldering.

Arrangement of Relay 26A

As shown in FIG. 13, in this embodiment, the relay 26A is disposed on the surface of the electrical component-mounting board 72 at a position located on the left side of the relay terminals 81 in FIG. 13 in order to prevent interference with the relay terminals 81. The relay 26A is disposed such that the fixed contact FC and the movable contact MC are located on a small heat amount-generating region 83 side, which will be described later.

As shown in FIG. 13, in the casing 71, substantially the left half region of the electrical component-mounting board 72 on which the relay 26A is mounted in FIG. 13 serves as a large heat amount-generating region 82 whose temperature becomes relatively high due to heat generated by the relay 26A and the electrical component-mounting board 72 when current flows through the relay 26A. On the other hand, in the casing 71, a region that is substantially the right half region in FIG. 13 and is located on the back side of the expanded portion 80 in the direction of the Z-axis serves as the small heat amount-generating region 83 that generates a smaller amount of heat than the relay 26A does when current flows through the relay 26A. In this embodiment, part of the electrical component-mounting board 72 is disposed in the small heat amount-generating region 83. Since no relays 26 and 26A are mounted on the portion of the electrical component-mounting board 72 that is disposed in the small heat amount-generating region 83, that portion generates a smaller amount of heat than the relay 26A does when current flows through the relay 26A compared with the portion of the electrical component-mounting board 72 that is disposed in the large heat amount-generating region 82.

Since no relays 26 and 26A are mounted on the small heat amount-generating board 73, the small heat amount-generating board 73 generates a smaller amount of heat than the electrical component-mounting board 72 does when current flows through the relays 26 and 26A.

In the relay case 32 of the relay 26A, the fixed contact FC and the movable contact MC of the relay 26A are disposed at positions located on the right end side in FIG. 13. The small heat amount-generating region 83 is formed on the right side of the relay 26A, and the small heat amount-generating board 73 is disposed in the small heat amount-generating region 83. In other words, the relay 26A is configured to be disposed such that the fixed contact FC and the movable contact MC are located on the small heat amount-generating board 73 side. Thus, the temperature of the side wall 43 of the relay case 32 of the relay 26A that is located near the fixed contact FC and the movable contact MC is relatively likely to decrease.

Heat-Releasing Structure

As shown in FIG. 14, a cut-out portion 84 is formed at a position corresponding to the relay 26A in the inner wall portion 79 of the second casing member 75 by cutting out the inner wall portion 79. In this embodiment, the cut-out portion 84 is formed in the inner wall portion 79 located on the right side of the relay 26A in FIG. 14. Since the cut-out portion 84 is formed, the inside and the outside of the casing 71 near the relay 26A are divided by only the outer wall portion 77 of the first casing member 74.

Since configurations other than the above-described configurations are substantially the same as those of Embodiment 1, the same members are denoted by the same reference numerals, and redundant descriptions are omitted.

With this embodiment, the electrical component-mounting board 72 and the small heat amount-generating board 73 are disposed so that at least portions thereof overlap each other. This makes it possible to improve a wiring density in a region where the electrical component-mounting board 52 and the small heat amount-generating board 53 overlap each other.

Other Embodiments

The present invention is not limited to the embodiment explained by the above description and the drawings. Other embodiments, which will be explained below, for example, are also included in the technical scope of the present invention.

(1) The small heat amount-generating boards 13, 53, and 73 may be omitted.

(2) Although the present embodiments were configured so that the inner wall portions 22, 59, and 79 were respectively provided with the cut-out portions 45, 61, and 84, the outer wall portions 19, 57, and 77 may be respectively provided with the cut-out portions 45, 61, and 84.

(3) Although the present embodiments were configured so that the respective upper wall portions 21, 58, and 78 of the second casing members 17, 55, and 75 were provided with the air vents 44, there is no limitation to this, and the respective bottom wall portions 18, 56, and 76 of the first casing members 16, 54, and 74 may be provided with the air vents 44. Also, the air vents 44 may be omitted.

(4) Although the present embodiments were configured so that the air vents 44 were formed by a plurality of elongated slits arranged in a line, there is no limitation to this, and the air vents 44 can have any shape as needed, such as a circular shape, an oval shape, and a polygonal shape (e.g., triangular shape or pentagonal shape).

(5) Each of the electrical junction boxes 10, 50, and 70 described in the above embodiments can be installed in a vehicle such that any one of the directions of the X-axis, the Y-axis and the Z-axis shown in the drawings coincides with the vertical direction or the horizontal direction. Also, the electrical junction box 10 can be installed in a vehicle such that any one of the directions of the X-axis, the Y-axis and the Z-axis shown in the drawings are inclined to the vertical direction or the horizontal direction.

(6) Although the relay 26A was given as an example of electrical components in the above embodiments, the present invention can be applied to an electrical junction box using, as the electrical component, a contact type electrical component in which a terminal portion has a contact other than the relay 26. Also, a contact structure of the relay 26A used as the electrical component may be a b-contact structure or a c-contact structure as well as an a-contact structure.

(7) Although the above embodiments describe the relay 26A configured so that the temperature of the fixed contact terminal portion 38 having no magnetic member 42 is likely to decrease compared with that of the movable contact terminal portion 39 having the magnetic member 42 that is brought into contact with the coil 34, the present invention can be applied to an electrical junction box using a relay in which the temperatures of the movable contact terminal portion 39 and the fixed contact terminal portion 38 are equal to each other due to influences from an external environment or the like, for example. In this case, it is possible to prevent dew condensation and freezing on both the movable contact MC and the fixed contact FC. Also, the present invention can be applied to an electrical junction box using a relay in which the temperature of the movable contact terminal portion 39 is likely to decrease compared with that of the fixed contact terminal portion 38 due to influences from an external environment or the like. In this case, it is possible to prevent dew condensation and freezing on the movable contact MC.

(8) The electrical component-mounting boards 52 and 72 may be configured so as to be respectively disposed on the back sides of the small heat amount-generating boards 53 and 72.

(9) Although the present embodiments are configured so that the temperature of the side wall 43 of the relay case 32 of the relay 26A is rapidly reduced, there is no limitation to this, and the upper wall or the bottom wall of the relay case 32 may be rapidly cooled.

The invention claimed is:

1. An electrical junction box comprising:
 a casing; and
 an electrical component that is accommodated in the casing and has an electrical component case and a terminal portion, the terminal portion being accommodated in the electrical component case and having a contact, wherein
 a small heat amount-generating region, that generates a smaller amount of heat than the electrical component generates when current flows through the electrical component, is formed in the casing,
 the electrical component is disposed such that the contact is located on the small heat amount-generating region side,
 the casing accommodates an electrical component-mounting board on which the electrical component is mounted, and a small heat amount-generating board that is disposed in the small heat amount-generating region and generates a smaller amount of heat than the electrical component-mounting board generates when current flows through the electrical component, and
 the electrical component is disposed such that the contact is located on the small heat amount-generating board side.

2. The electrical junction box according to claim 1, wherein the electrical component-mounting board and the small heat amount-generating board are disposed on substantially the same plane.

3. The electrical junction box according to claim 1, wherein the electrical component-mounting board and the small heat amount-generating board are disposed on different planes.

4. The electrical junction box according to claim 3, wherein the electrical component-mounting board and the small heat amount-generating board are disposed so that at least portions thereof overlap each other.

5. The electrical junction box according to claim 1, wherein the casing is provided with an electrical component-side air vent through which the inside and the outside of the casing are in communication with each other at a position near the electrical component.

6. The electrical junction box according to claim 1, wherein the casing is provided with a small heat amount generation-side air vent through which the outside of the casing and the small heat amount-generating region are in communication with each other.

7. The electrical junction box according to claim 1, wherein the casing has a double wall structure including an inner wall portion and an outer wall portion that is disposed outside the inner wall portion, and a cut-out portion is formed at a position near the electrical component in one of the inner wall portion and the outer wall portion.

8. The electrical junction box according to claim 1, wherein a relay is used as the electrical component, and the terminal portion includes, as a contact, at least a fixed contact and a movable contact that can be brought into contact with or separated from the fixed contact.

* * * * *